United States Patent [19]

Imai et al.

[11] Patent Number: 5,343,072

[45] Date of Patent: Aug. 30, 1994

[54] METHOD AND LEADFRAME FOR MAKING ELECTRONIC COMPONENTS

[75] Inventors: Hiroshi Imai; Tadashi Murakami; Tetsuya Mimura, all of Kyoto; Masao Yamamoto, Takatsuki; Yuji Kosumi, Uji; Masashi Asai; Yasunori Aoki, both of Kyoto, all of Japan

[73] Assignee: Rohm Co., Ltd., Kyoto, Japan

[21] Appl. No.: 976,667

[22] Filed: Nov. 16, 1992

Related U.S. Application Data

[62] Division of Ser. No. 737,143, Jul. 29, 1991, abandoned.

[30] Foreign Application Priority Data

| Aug. 20, 1990 | [JP] | Japan | 2-219394 |
| Mar. 4, 1991 | [JP] | Japan | 3-064035 |
| Jun. 7, 1991 | [JP] | Japan | 3-136751 |

[51] Int. Cl.⁵ .............................. H01L 23/48
[52] U.S. Cl. .................. 257/666; 257/667; 257/670
[58] Field of Search ............... 257/666, 667, 670

[56] References Cited

U.S. PATENT DOCUMENTS

| 4,809,054 | 2/1989 | Waldner | 257/670 |
| 5,049,527 | 9/1991 | Merrick et al. | 437/220 |
| 5,070,039 | 12/1991 | Johnson et al. | 437/217 |

FOREIGN PATENT DOCUMENTS

| 58-27332 | 2/1983 | Japan | 437/206 |

Primary Examiner—Mark V. Prenty
Attorney, Agent, or Firm—William H. Eilberg

[57] ABSTRACT

A leadframe includes a first longitudinal side band, a second longitudinal side band integrally connected to the first band by transverse sectioning bars spaced longitudinally of the leadframe, a plurality of first leads located closer to the first side band between the respective sectioning bars, and a plurality of second leads integrally connected to the second side band between the respective sectioning bars. The first leads are integrally connected to the respective sectioning bars only via twistably slenderized segments. Each first lead can be turned over toward a corresponding second lead by torsioning the twistable segments.

18 Claims, 13 Drawing Sheets

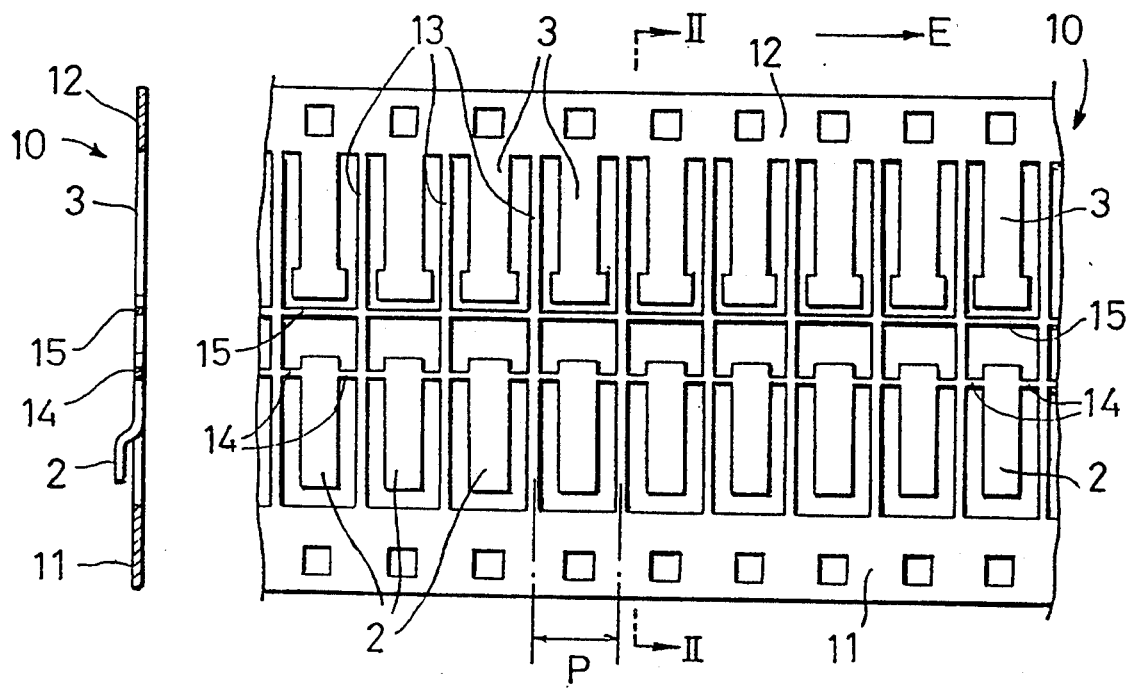
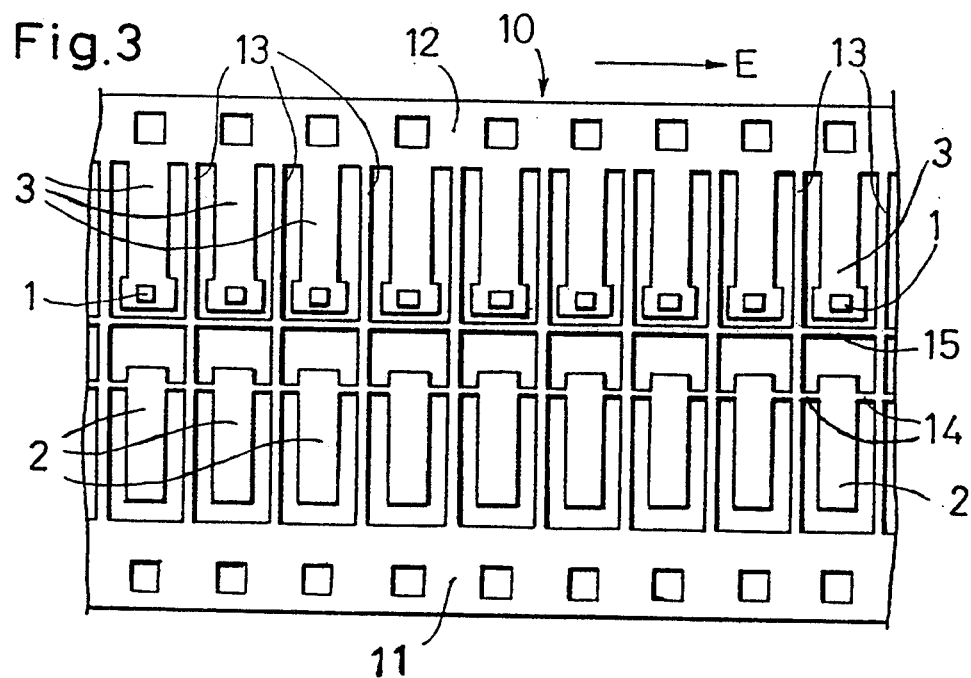

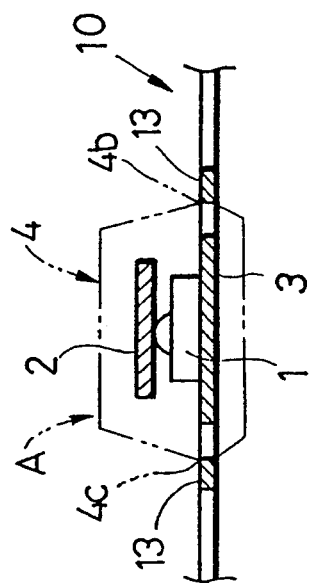
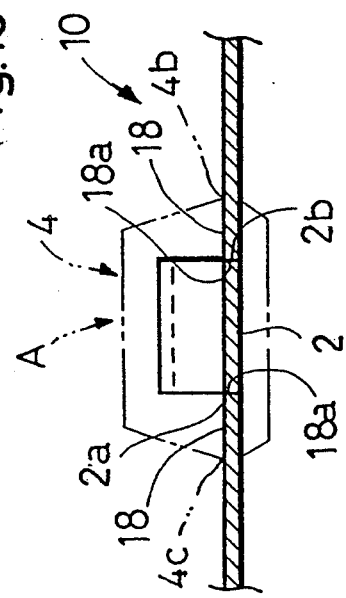
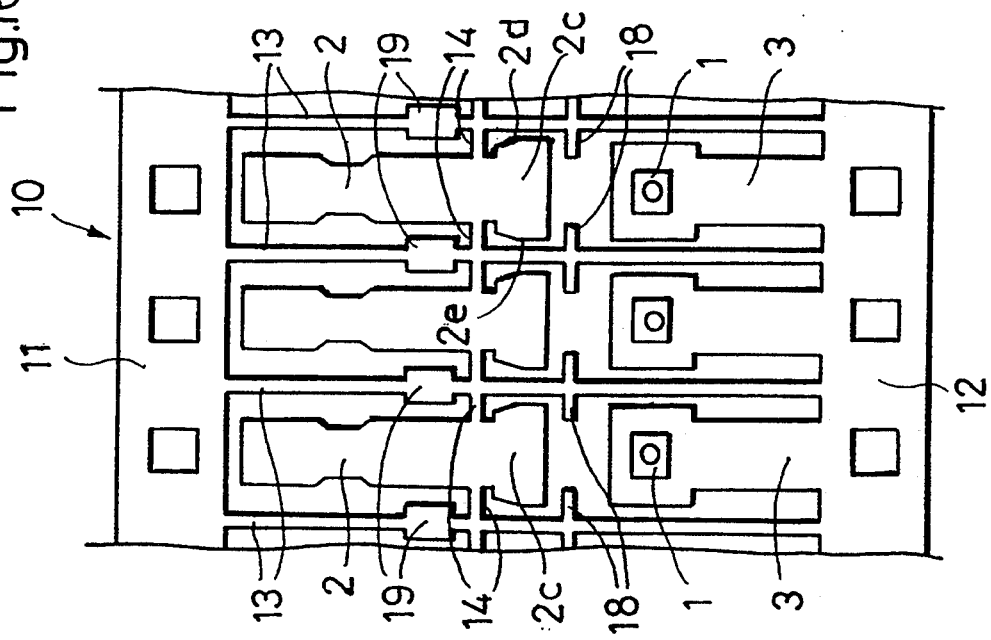

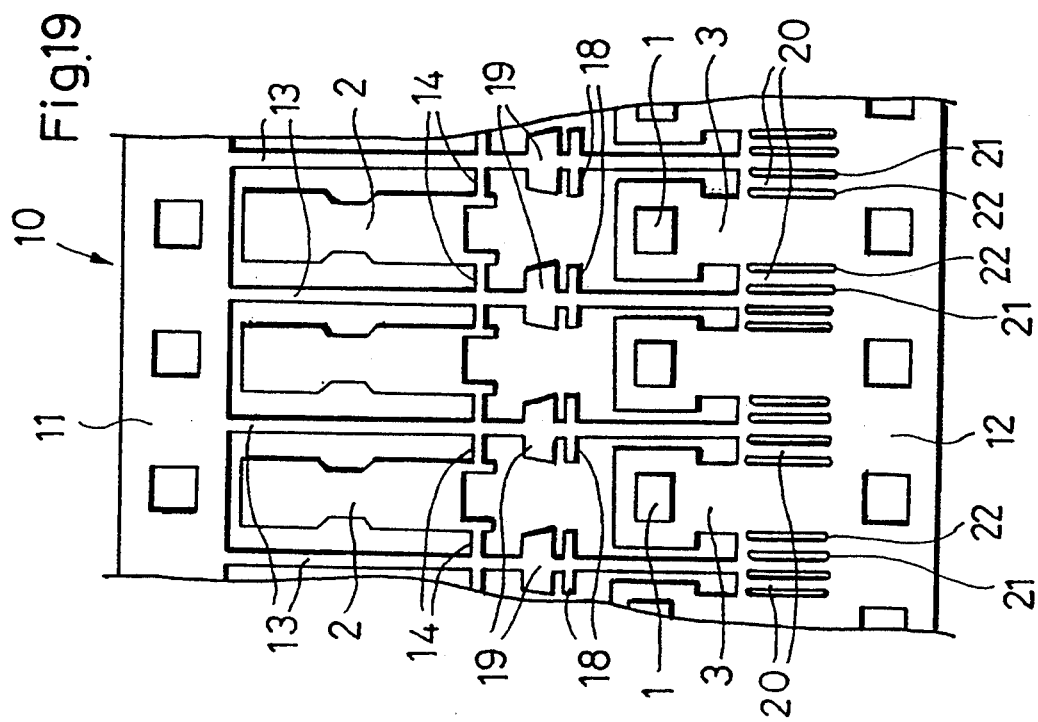
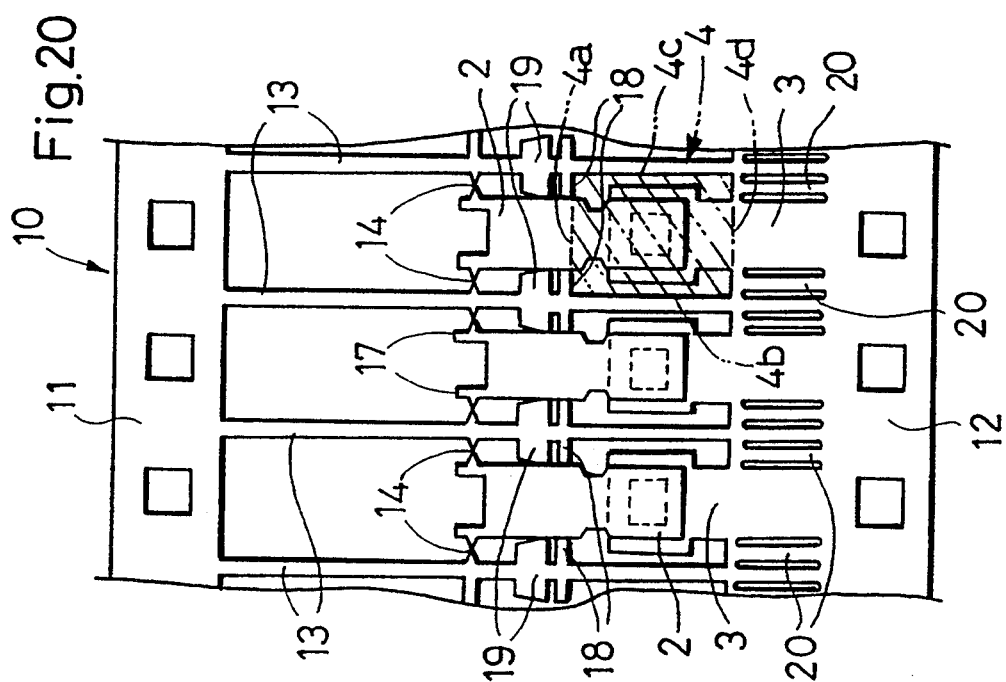

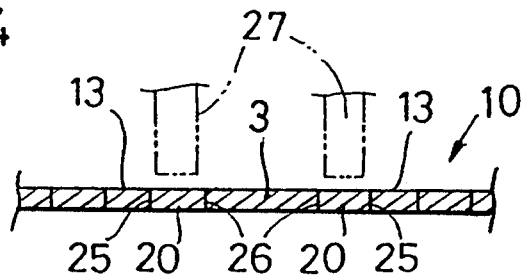
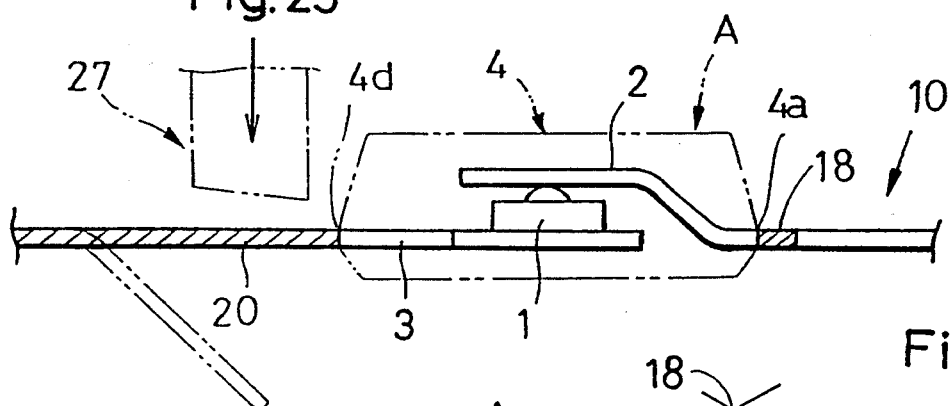
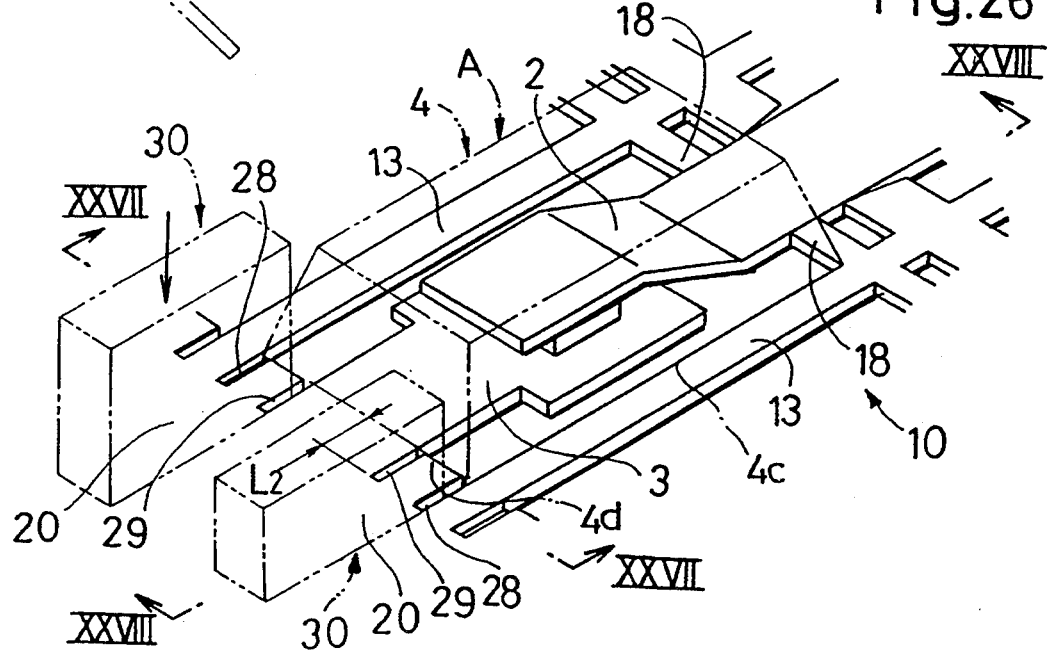
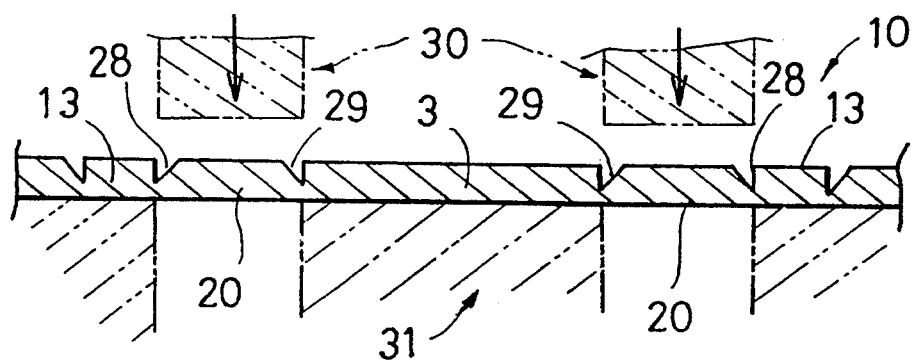

METHOD AND LEADFRAME FOR MAKING ELECTRONIC COMPONENTS

This application is a division of application Ser. No. 07/737,143, filed Jul. 29, 1991, and now abandoned.

BACKGROUND OF THE INVENTION

1. Field of the Invention

This invention relates to a method of manufacturing electronic components from a leadframe. It more particularly relates to a method of producing electronic components of the type wherein each semiconductor chip is sandwiched between a pair of leads for bonding and encapsulated hermetically in a molded resinous body. The invention also relates to a leadframe for advantageously carrying out the method.

2. Description of the Prior Art

As is well known, elongated or continuous leadframes are used for quantity production of electronic components, such as diodes, transistors, and so on. Various attempts have heretofore been made to improve the productivity of such a manufacturing process and to simplify the process in addition to enhancing the quality of the products.

Two typical prior art methods of manufacturing electronic components are now described with reference to FIGS. 33 to 36 of the accompanying drawings for the convenience of explanation.

In one typical prior art method shown in FIGS. 33 to 35, a pair of parallel leadframes 11', 12' respectively formed with aligned leads 2', 3' at a constant pitch P are transferred longitudinally thereof. During such transfer, semiconductor chips 1' are bonded to the respective leads 2' of one leadframe 11', as shown in FIG. 34. Subsequently, the pair of leadframes 11', 12' are brought closer to each other, so that the leads 3' of the other leadframe 12' is overlapped on the chips 1' for bonding thereto, as shown in FIG. 35. Finally, each chip 1' together with the associated leads 2', 3' is encapsulated in a molded resin body 4' which is cut off from the respective leadframes 11', 12' to provide an individual electronic component.

However, the above prior art method is disadvantageous in that two separate leadframes 11', 12' are required for production of electronic components, thereby posing handling inconvenience (e.g. requiring two separate transfer guides, and etc.) in addition to involving material waste. Further, because of the separate nature of the leadframes 11', 12', the respective leads 2', 3', which are kept free as projecting, are likely to come into contact with external objects particularly when the leadframes 11', 12' are separately handled. As a result, the leads may be subjected to unacceptable deformation during the manufacturing process, consequently resulting in a higher chance of quality deterioration.

According to another prior art method shown in FIG. 36 of the accompanying drawings and disclosed for example in Japanese Patent Application Laid-open No. 62-35549 (Laid-open: Feb. 16, 1987; Application No.: 60-176036; Filed: Aug. 8, 1985; Applicant: Mitsubishi Electric Corp.), an integral leadframe 10" is used which includes a pair of longitudinal bands 11", 12" connected together by transverse sectioning bars 13" spaced longitudinally of the leadframe at a constant pitch P. One longitudinal band 11" is formed with a group of first leads (longer leads) 2" which are spaced longitudinally of the leadframe and extend toward the other longitudinal band 12", whereas the other band 12" is formed with a group of second leads (shorter leads) 3" which are also spaced longitudinally of the leadframe and extend toward the one longitudinal band 11" in staggered relation to the group of first leads 2".

In manufacture, the integral leadframe 10" is transferred longitudinally thereof. During such transfer, a semiconductor chip 1" is bonded to each second lead 3". Subsequently, a corresponding first lead 2" is bent along a bending line C", so that the bent portion is overlapped on the chip 1". Finally, the chip together with the associated leads is hermetically molded in a resin body 4", and cut off from the leadframe to provide an individual electronic component.

Compared with the method shown in FIGS. 33 to 35, the method of FIG. 36 is advantageous in that electronic components can be produced from the single leadframe 10" which enables easier handling. Further, all of the leads 2", 3" are always located in the same plane of the leadframe throughout various stages of the manufacturing process. Thus, the longitudinal space between the two longitudinal bands 11", 12" is an area always protected by these bands, so that the leads 2", 3" arranged in this protected area are less likely to come into contact with external objects. Therefore, it is possible to avoid unexpected deformation of the leads, thereby improving the quality of the final products.

However, the prior art method of FIG. 36 is also disadvantageous in various points. First, the bent portion of each longer lead 2" causes a weight increase of the individual electronic component in addition to involving material waste. Secondly, each pair of leads 2", 3" are spaced longitudinally of the leadframe C before and after the molding operation, so that the resulting product must necessarily have an increased width S which also causes a weight increase. In the third place, this width increase also results in decrease in number of the products obtainable per unit length of the leadframe 10', thus causing material waste.

More importantly, the bending of the first leads 2" requires a relatively large force and therefore necessitates a slowdown in the transfer speed of the leadframe. Combined with the width increase of the individual products (therefore a length increase of the leadframe), such a slowdown greatly reduces the productivity of the manufacturing process, thus resulting in a cost increase.

In either of the prior art methods described above, the molded resinous body 4' (or 4") is formed by using a pair of molds (an upper mold and a lower mold) which, when closed, form a cavity for receiving injected fluid thermosetting resin. Obviously, one or both of the molds must be formed with grooves through which the first and second leads 2', 3' (or 2", 3") project out when sealingly closing the molds.

Indeed, it is very difficult to fit the projecting leads into the grooves of the molds in a well-sealed condition, and certain clearances are inevitably formed at the grooves even after closing the molds. Thus, when fluid resin is injected into the mold cavity, an small amount of resin enters into the grooves to form flashes.

The resinous flashes thus formed may come off and get into the mechanical and/or electrical systems during the subsequent process steps, consequently leading to operation troubles. Thus, it is necessary to provide a separate process unit for removing the flashes immediately after formation of the molded body, thereby resulting in production cost increase.

SUMMARY OF THE INVENTION

It is, therefore, an object of the present invention to provide a method of manufacturing electronic components wherein the above described problems of the prior art are eliminated or reduced.

Another object of the present invention is to provide a leadframe which is particularly suitable for carrying out the method of the present invention.

A further object of the present invention is to speed up the overall production process in manufacturing electronic components.

According one aspect of the present invention, there is provided a method of manufacturing electronic components from a leadframe which comprises: a plurality of first leads integral with the leadframe only via twistable segments extending transversely of the respective first leads; a plurality of second leads integral with the leadframe, the second leads being initially spaced from but arranged substantially in alignment with the respective first leads to form pairs with the respective leads; the method comprising the steps of: bonding a semiconductor chip to one of each paired leads; turning over each first lead toward a corresponding second lead by torsioning the twistable segments, so that the semiconductor chip is interposed between the first and second leads; forming a molded resinous body for enclosing the semiconductor chip while allowing the first and second leads to partially project from the resinous body; and separating the first and second leads from the leadframe.

According to another aspect of the present invention, there is provided a leadframe comprising: a plurality of first leads; a plurality of second leads integral with the leadframe, the second leads being initially spaced from but arranged substantially in alignment with the respective first leads to form pairs with the respective leads; wherein the respective first leads are rendered integral with the leadframe only via twistable segments extending transversely of the respective first leads, each first lead overlapping a corresponding second lead when the first lead is turned over toward the corresponding second lead by torsioning the twistable segments.

According to the present invention, the first leads need only be turned over toward the respective second leads by torsioning the twistable segments which may be slenderized. Such turning over can be performed with a much smaller force than required for bending the first lead itself. Thus, the transfer speed need not be slowed down, resulting in production speed increase and production cost decrease.

Further, according to the present invention, the first and second leads are arranged in alignment. Thus, a greater number of electronic components can be obtainable from a unit length of the leadframe than the prior art wherein pairs of leads are arranged in staggered relation. Further, the individual electronic components can be reduced in size and weight.

Moreover, the pairs of leads are incorporated in the single leadframe, and the first leads need only be turned over for overlapping onto the respectively aligned second leads. Thus, positional deviation in such overlapping is less likely to occur, as compared with the prior art wherein two separate leadframes are separately transferred.

Preferably, the leadframe further comprises a support bar which is integral with the leadframe and extends for penetration through the molded body without contacting the first and second leads. In this case, the production process may further comprise the steps of: performing at least one additional process step after the first and second leads are separated from the leadframe but while the molded body is supported by the leadframe via the support bar; and cutting the support bar off the leadframe.

Examples of additional process step include property checking of the electronic components, plating the respective leads with solder, marking, and bending of the respective leads. When the support bar is incorporated, such additional steps are performed successively and efficiently by utilizing the leadframe for aligned transfer of the individual electronic components, thereby further improving the productivity.

Advantageously, each first lead has a pair of openable legs for connection to the twistable segments. Such an arrangement prevents adverse influences which may result from length reduction of the twistable segments at the time of turning over the first lead.

According to a preferred embodiment of the present invention, the leadframe may further incorporates first dam means for defining one side of the molded resinous body from which the first lead projects out, and additionally or alternatively second dam means for defining another side of the molded resinous body from which the second lead projects out. With such an arrangement, the molds for forming the resinous body need not have grooves for receiving the respective leads, and the leadframe need only be compressively interposed between the molds. Thus, flash formation at the respective leads can be effectively prevented.

Other objects, features and advantages of the present invention will be fully understood from the following detailed description of the preferred embodiments given with reference to the accompanying drawings.

BRIEF DESCRIPTION OF THE DRAWINGS

In the accompanying drawings:

FIG. 1 is a plan view showing a leadframe according to a first embodiment of the present invention;

FIG. 2 is a sectional view taken on lines II—II in FIG. 1;

FIG. 3 is a plan view showing the same leadframe after chip bonding;

FIG. 14 is a sectional view taken along lines XIV—XIV in FIG. 12;

FIG. 15 is a sectional view taken along lines XV—XV in FIG. 12;

FIG. 16 is a plan view showing a leadframe according to a fourth embodiment of the present invention;

FIG. 19 is a plan view showing a leadframe according to a fifth embodiment of the present invention;

FIG. 20 is a plan view showing the leadframe of FIG. 19 after the first leads have been turned over for package molding;

FIG. 24 is a sectional view taken along lines XXIV—XXIV in FIG. 23;

FIG. 25 is a sectional view taken along lines XXV—XXV in FIG. 23;

FIG. 26 is a fragmentary perspective view showing a leadframe according to a seventh embodiment of the present invention;

FIG. 27 is a sectional view taken along lines XXVII—XXVII in FIG. 26;

DETAILED DESCRIPTION OF THE PREFERRED EMBODIMENTS

Figure 4:
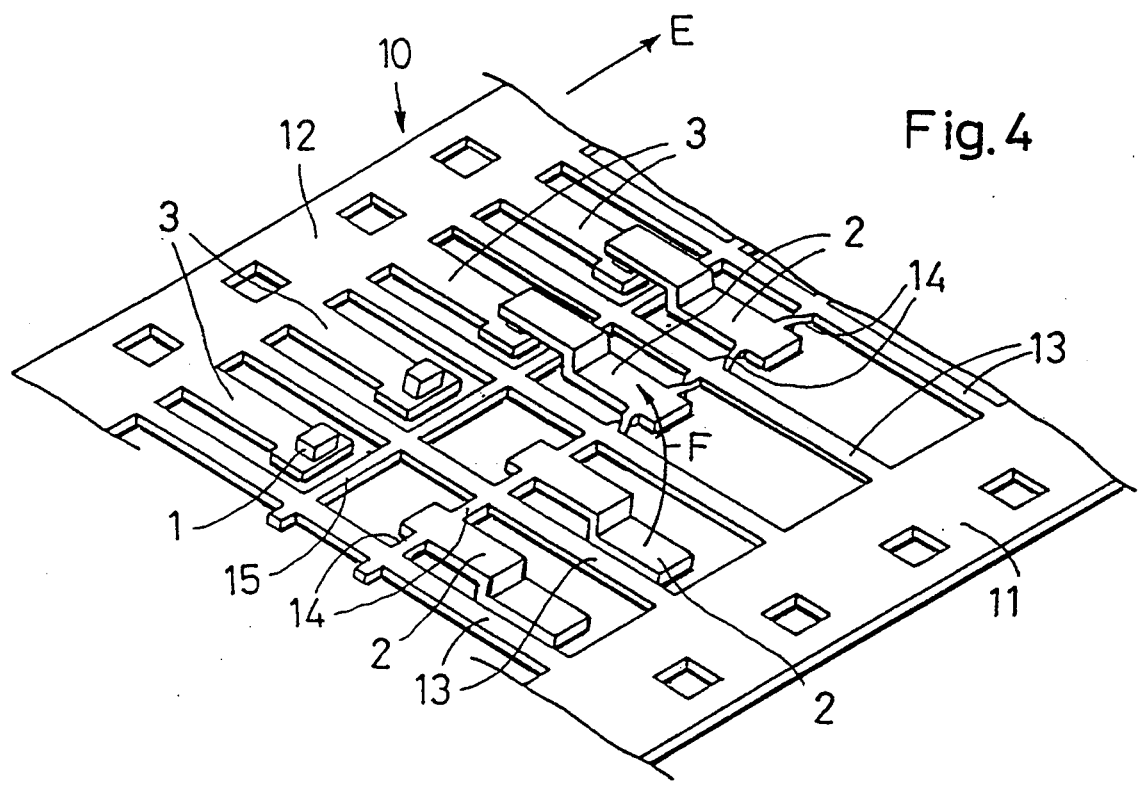
FIG. 4 is a perspective view showing the same leadframe at the time of turning over the first leads of the leadframe.
Figure 5:
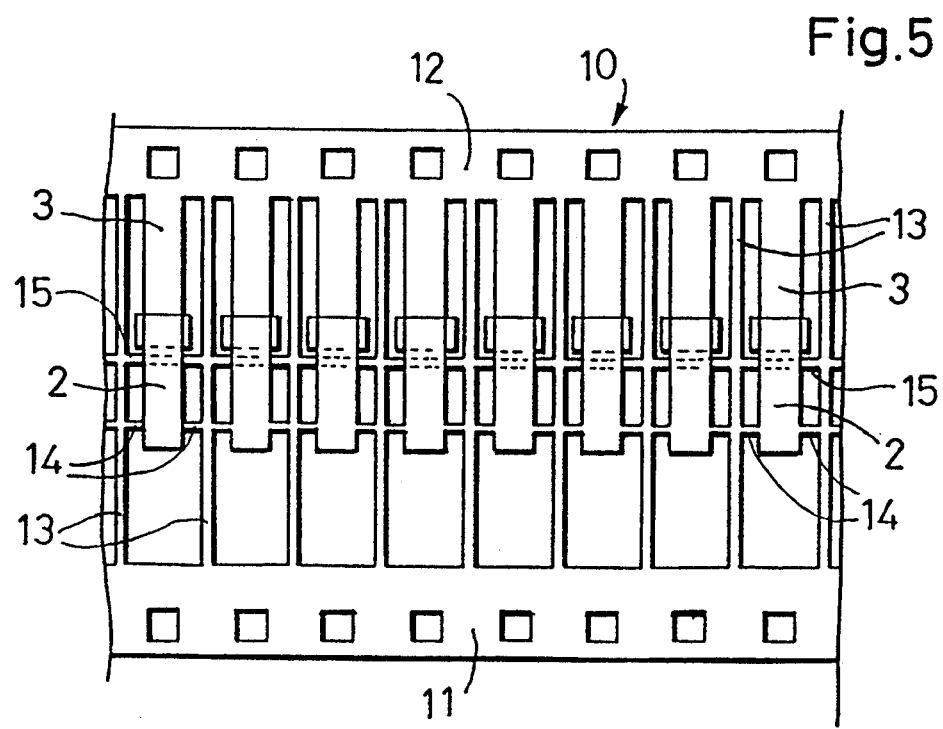
FIG. 5 is a plan view showing the same leadframe after the first leads have been turned over.

Various embodiments of the present invention are shown in FIGS. 1 through 32 of the accompanying drawings. Throughout these Figures, like parts are designated by the same reference numerals to clarify the relation between the different embodiments for readier comparison with each other.

EMBODIMENT 1

FIGS. 1 through 7 show a first embodiment of the present invention. A leadframe according to this embodiment, which is generally designated by reference numeral 10, includes a first longitudinal side band 11 and a second longitudinal side band 12 integrally connected to the first side band by means of transverse sectioning bars 13 arranged at a suitable pitch P longitudinally of the leadframe. The leadframe may be formed from a metallic plate to have a suitable width and a substantially continuous length.

A group of first leads 2 are arranged adjacent to the first side band 11 between the respective sectioning bars 13. Each first lead has an inner portion (closer to the second side band 12) integrally connected to the sectioning bars 13 by means of twistably slenderized segments 14. Further, the first lead has an outer portion (closer to the first side band 11) which is kept free.

The second side band 12 is integrally formed with a group of second leads 3 arranged substantially in alignment with the first leads 2 transversely of the leadframe 10. Thus, the first and second leads 2, 3 form lead pairs arranged within the respective spaces between the sectioning bars 13.

The respective sectioning bars 13 are integrally connected together by support bars 15 extending longitudinally of the leadframe 10. Each support bar 13 is located between the corresponding lead pair 2, 3 without contacting them.

In manufacturing electronic components, the leadframe 10 is transferred longitudinally thereof, as indicated by an arrow E in FIG. 1. During such transfer, a semiconductor chip 1 is bonded onto the tip (inner end) of each second lead 3. Thereafter, the corresponding first lead 2 is turned over by torsioning the twistable segments 14, as shown by an arrow F in FIG. 4. As a result, the free end portion of the first lead 2 lies on the chip 1, and the chip 1 is sandwiched between the lead pair 2, 3 (see also FIG. 5).

Figure 6:
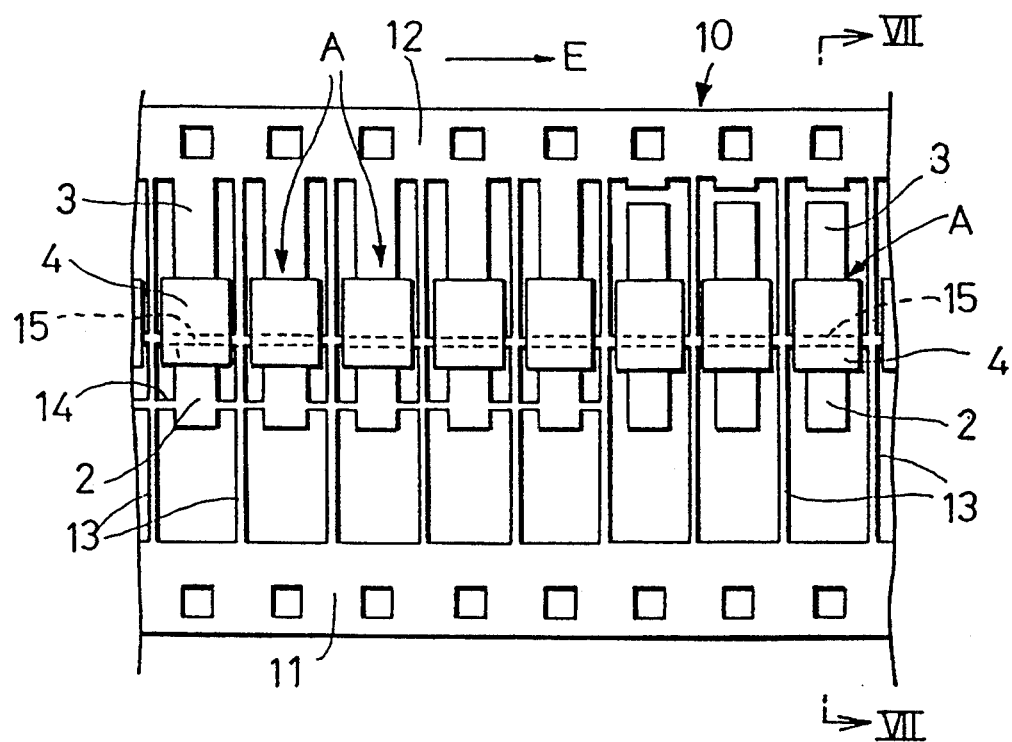
FIG. 6 is a plan view also similar to FIG. 3 but showing the leadfree after package molding.

Subsequently, the lead pair 2, 3 is interposed between an unillustrated pair of molds (an upper mold and a lower mold) for forming a molded body 4 which is made of thermosetting resin for example, as shown in FIG. 6. A packaged electronic component A thus obtained is then rendered electrically separated from the leadframe 10 by punching or severing at the second lead 3 and the respective twistable segments 14.

Figure 7:
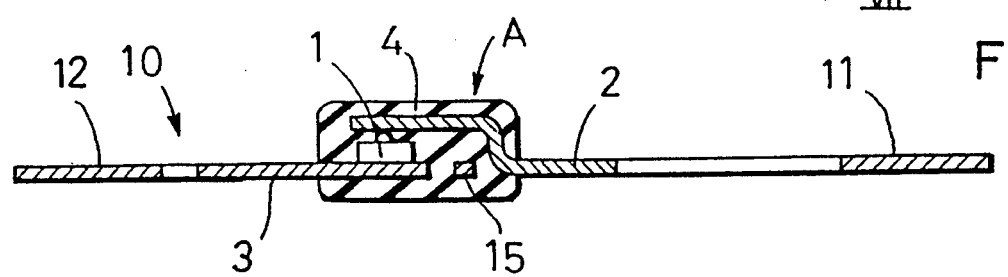
FIG. 7 is a sectional view taken along lines VII—VII in FIG. 6.

As clearly shown in FIGS. 6 and 7, the support bar 15 integral with the sectioning bars 13 extends through the molded body 4, so that the electronic component A still remains on the leadframe 10 even after electrical separation therefrom. Thus, the leadframe 10 can be utilized for subsequent transfer of the electronic component A to perform any subsequent process steps, thereby simplifying the overall manufacturing process. These subsequent process steps may include plating the surfaces of the respective leads 2, 3 with solder, checking properties of the electronic component by passing electric current across the respective leads 2, 3 marking the electronic component, suitably bending the respective leads 2, 3, and so forth.

In the final stage of production, the electronic component A is separated from the leadframe 10 by punching or severing the support bar 15.

According to the first embodiment illustrated in FIGS. 1-7, the semiconductor chip 1 is bonded to the second lead 3. However, it is obvious that the semiconductor chip may be bonded to the first lead 2 which is subsequently turned over.

EMBODIMENT 2

Figure 8:
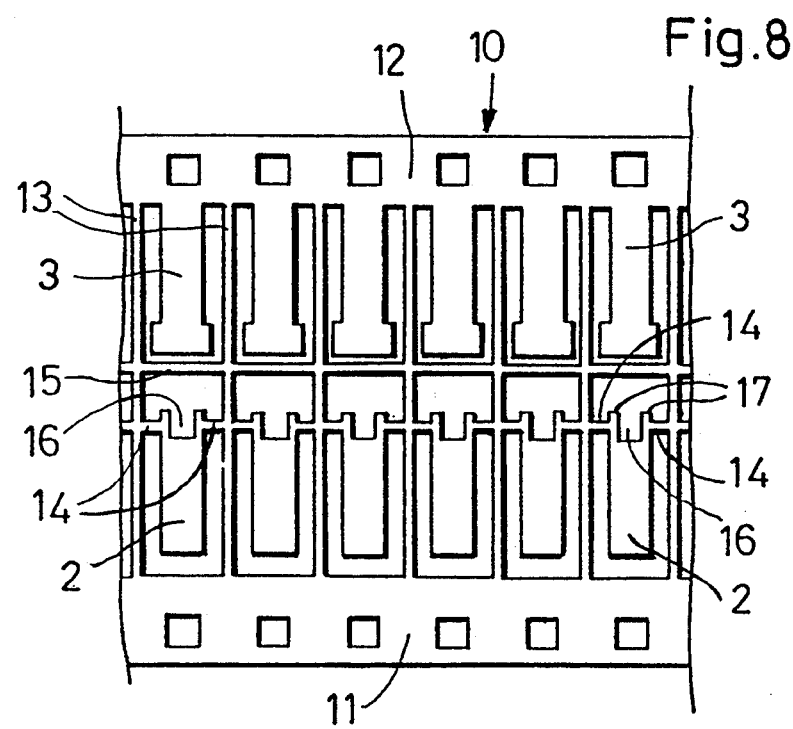
FIG. 8 is a plan view showing a leadframe according a second embodiment of the present invention.
Figure 9:
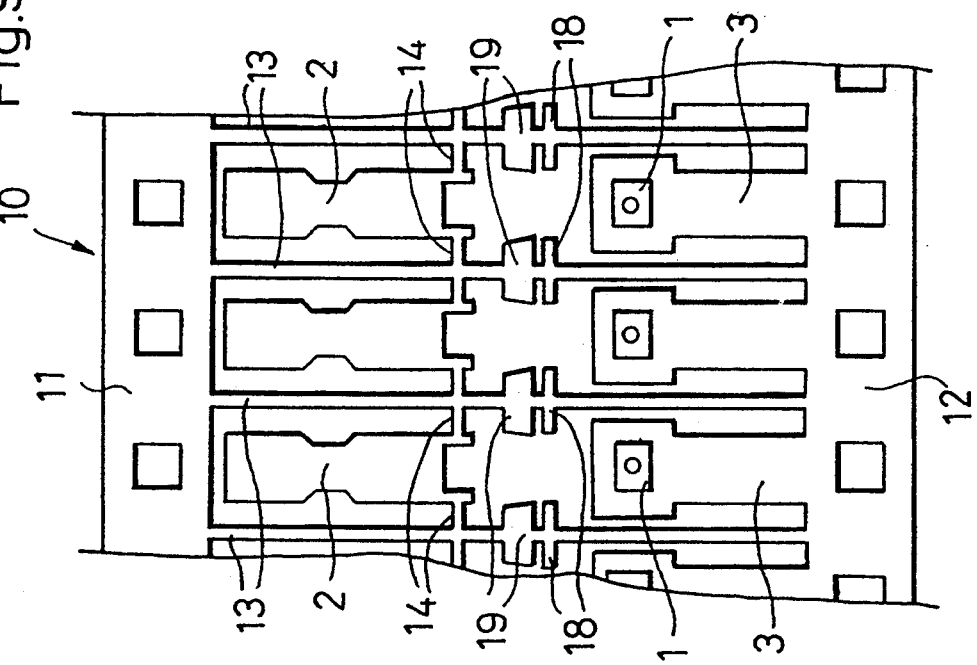
FIG. 9 is a plan view showing a leadframe according to a third embodiment of the present invention.

FIG. 8 shows a second embodiment of the present invention which is similar to the first embodiment but differs therefrom only in one respect.

Specifically, as shown in FIG. 8, each first lead 2 has an inner end (which later becomes an outer end after turning over) formed with a cutout 16. Thus, a pair of openable legs 17 are formed at the inner end of the first lead for connection to the transverse sectioning bars 13 through the twistable segments 14.

When the first lead 2 is turned over, the twistable segments 14 are torsionally deformed with inevitable reduction in their length. Such length reduction, though individually small, is cumulative for all first leads 2, and the cumulated length reduction is applied to the leadframe 10. Thus, if no countermeasure is taken, the leadframe 10 may be deformed to hinder longitudinal transfer thereof.

With the arrangement shown in FIG. 8, the legs 17 of the first lead 2 are openable to allow for the length reduction of the twistable segments 14 at the time of turning over the first lead. Thus, the length reduction of the twistable segments 14 does not result in deformation of the leadframe.

EMBODIMENT 3

FIGS. 9 through 15 show a third embodiment of the present invention which is similar to the foregoing embodiments but differs therefrom in the following respects.

According to the third embodiment, the respective sectioning bars 13 are integrally formed with dam portions 18 which form pairs in the respective spaces between the sectioning bars 13. Each pair of dam portions 18 define one side 4a of each molded resinous body 4 and respectively have end faces 18a (see FIG. 12) directed to each other with a suitable spacing.

Figure 10:
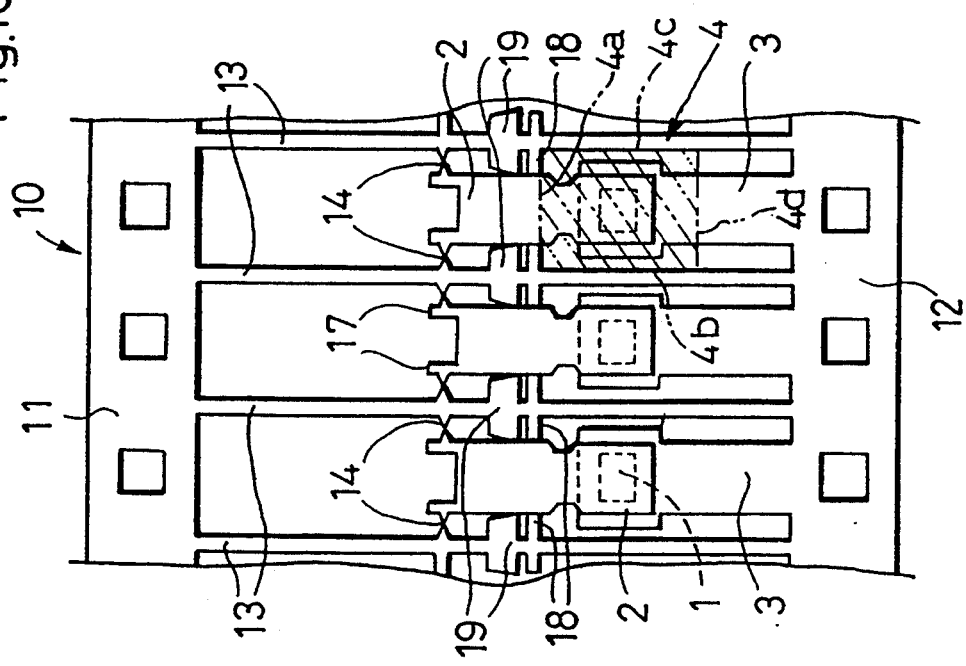
FIG. 10 is a plan view showing the leadframe of FIG. 9 after the first leads have been turned over.
Figure 11:
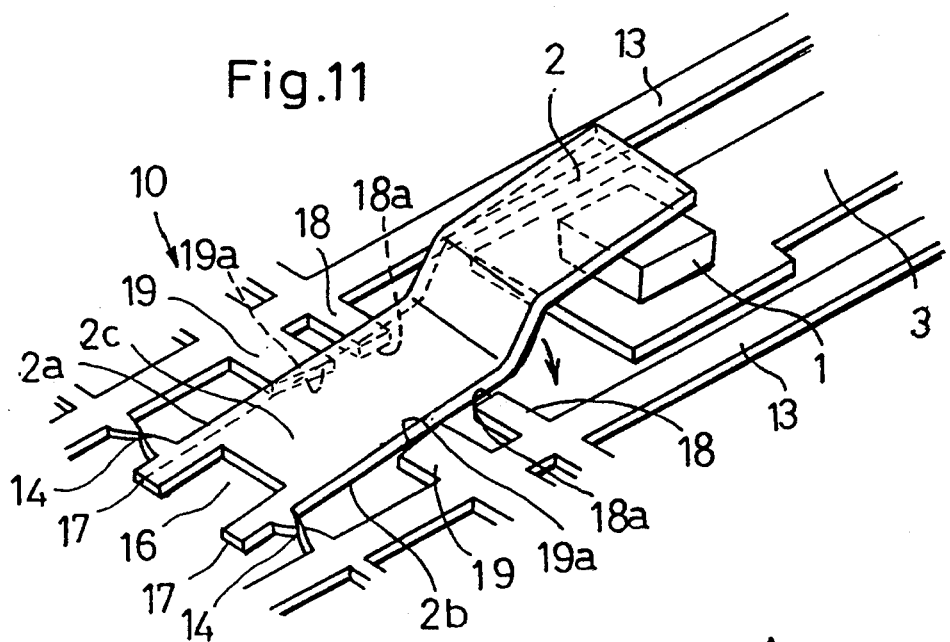
FIG. 11 is an enlarged fragmentary perspective view showing the leadframe of FIG. 9 at the time of turning over the first leads.
Figure 12:
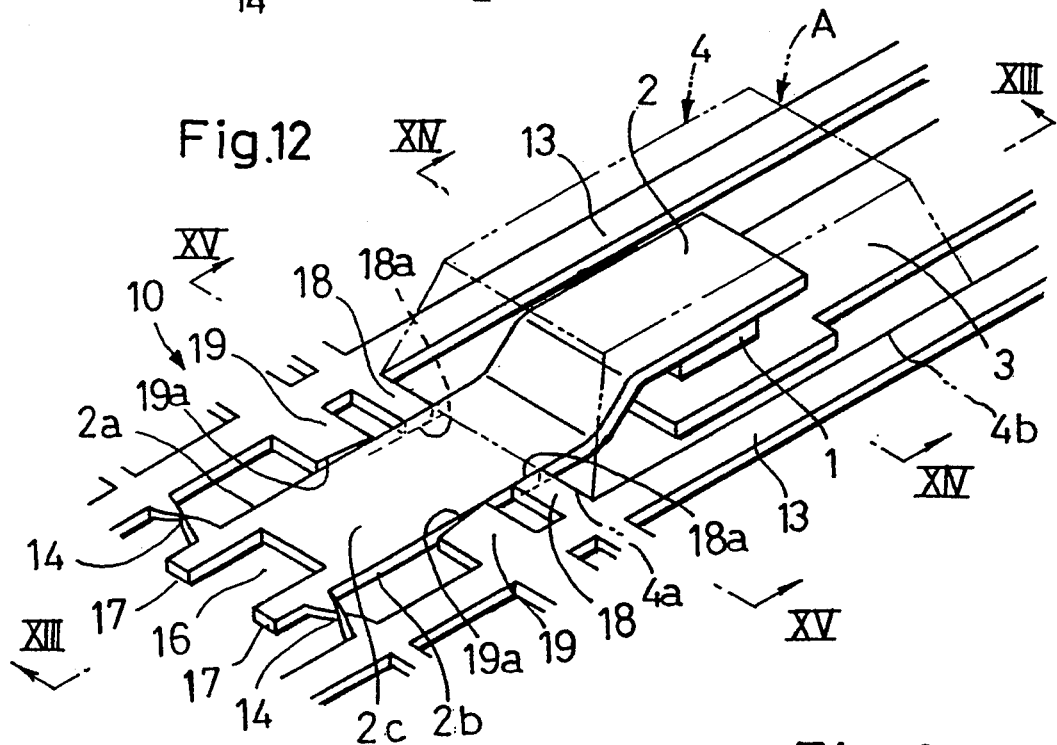
FIG. 12 is an enlarged fragmentary perspective view showing the leadframe of FIG. 9 at the time of package molding.
Figure 13:
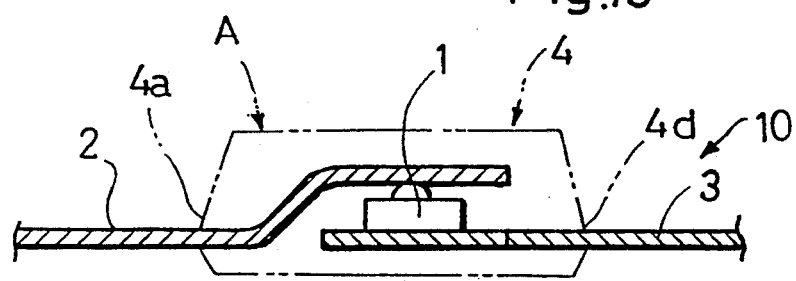
FIG. 13 is a sectional view taken along lines XIII—XIII in FIG. 12.

When turned over, each first lead 2 snugly fits between the corresponding pair of dam portions 18, as shown in FIG. 10. In this condition, both lateral faces 2b, 2c (FIG. 12) come into intimate contact with the end faces 18a of the paired dam portions.

The respective sectioning bars 13 are further formed integrally with guide portions 19 adjacent to the dam portions 18. Each guide portion 19 has an inclined guide face 19a which comes into sliding contact with the corresponding first lead 2 in turning-over movement, thereby exactly guiding it into between the corresponding pair of dam portions 18.

In forming the molded resinous body 4 after the first lead 2 is turned over, the dam portions 18 need only be sandwiched between the upper and lower molds (not shown) because the dam portions themselves prevent outward flow of the injected fluid resin. In the absence of the dam portions 18, on the other hand, the molds need have a groove for projectably receiving the first lead 2 when the molds are closed, and such a groove may allow slight outward flow of the injected fluid resin with resultant formation of flashes. Thus, the dam portions 18 provide the dual function of preventing flash formation (at one side 4a) while simplifying the mold structure (omission of a lead receiving groove).

Further, the guide portions 19 insure proper and smooth positioning of the first lead 2 relative to the dam portions 18 and the second lead 3 even if the first lead 2 is turned over quickly. Thus, the production process speed may be correspondingly increased.

Moreover, in the illustrated third embodiment (and in any subsequent embodiments as well), the sectioning bars 13 are utilized for defining or damming other two sides 4b, 4c of the molded resinous body 4. Thus, flash formation is effectively prevented or reduced at least at three sides of the molded resinous body.

The dam portions 18 and the guide portions 19 may be punched off before passing electric current across the first and second leads 2, 3 for checking the performance of the electronic component A. Alternatively, the dam portions and the guide portions may be bent upward or downward out of electric conduction with the first lead 2 at the time of performing performance checking.

According to the illustrated third embodiment, each guide portion 19 is shown to have an inclined guide face 19a. Alternatively, the first lead 2 is made to have an inclined guide surface, whereas the guide portion 19 itself is not provided with an inclined surface. Further, the third embodiment may be modified to incorporate support bars similar to those indicated at 15 in FIGS. 1 through 8.

EMBODIMENT 4

Figure 17:
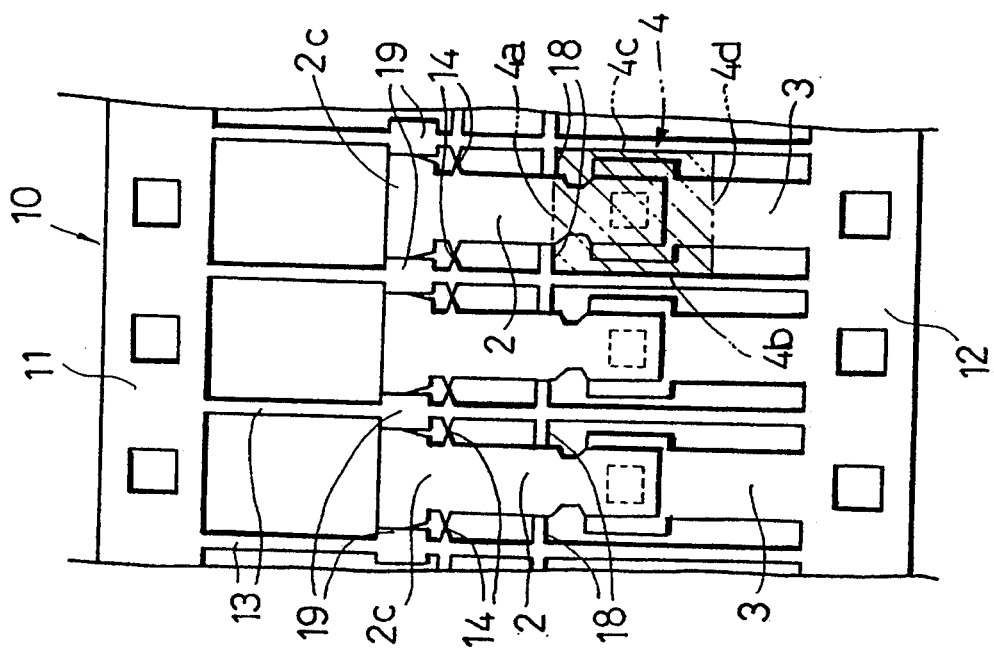
FIG. 17 is a plan view showing the leadframe of FIG. 16 after the first leads have been turned over for package molding.
Figure 18:
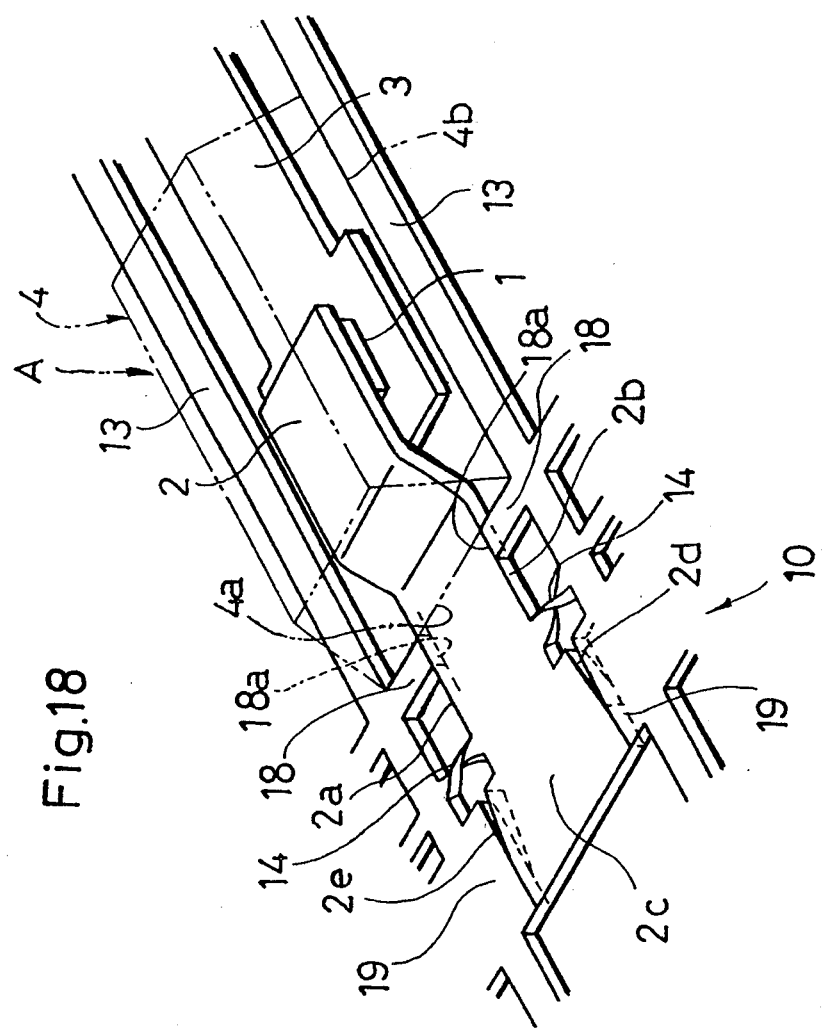
FIG. 18 is an enlarged fragmentary perspective view showing the leadframe of FIG. 16 at the time of package molding.

FIGS. 16 through 18 illustrate a fourth embodiment which is similar to the third embodiment but differs therefrom in the following respects.

According to the fourth embodiment, the guide portions 19 are located away from the dam portions 18. Specifically, the dam portions 18 are arranged on the side of the twistable segments 14 closer to the second side band 12, whereas the guide portions 19 are disposed on the side of the twistable segments 14 closer to the first side band 11.

Unlike the third embodiment, each guide portion 19 has no inclined guide face. Instead, the corresponding first lead 2 has an inner end 2c which is formed with a pair of inclined guide faces 2d. When turning over the first lead 2, the pair of inclined guide face 2d cooperate with the corresponding pair of guide portions 19 for exactly guiding the first lead 2 into between the corresponding pair of dam portions 18.

Further, the inner end 2c of the first lead 2 is also formed with a pair of non-inclined faces 2e which come into intimate contact with the corresponding guide portions 19 when turning over the first lead, as shown in FIGS. 17 and 18. As a result, the inner end 2c of the first lead 2 becomes substantially continuous with the guide portions 19.

As previously described in connection with the first embodiment, the first and second leads 2, S are plated with solder after the molded resinous body 4 is formed. While fluid, solder has the tendency of bulging due to its surface tension, and such tendency become more pronounced when solder is applied to a limited area.

However, in the condition shown in FIGS. 17 and 18, the inner end 2c of the first lead 2 is substantially continuous with the corresponding guide portions 19, and solder applied to the first lead 2 finds its way out onto the sectioning bars 13 (i.e., the leadframe 10) through the guide portions 19. Thus, the guide portions 19 provide an escaping way to prevent bulging of solder on the first lead 2, thereby enabling relatively uniform application of solder.

The fourth embodiment described above may be modified slightly while retaining the same advantage. For instance, the inner end 2c of the first lead 2 may be made to have only the non-inclined faces 2e, whereas each guide portion 19 may be made to have a combination of an inclined guide face and a non-inclined face.

EMBODIMENT 5

FIGS. 19 through 22 represent a fifth embodiment of the present invention which is similar to the third embodiment of FIGS. 9–15 but differs therefrom in the following respects.

The leadframe 10 according the fifth embodiment incorporates two kinds of dam portions which include first dam portions 18 and second dam portions 20. Similarly to the third embodiment, the first dam portions 18 are associated with the respective first leads 2 and the respective guide portions 19. On the other hand, the second dam portions 20 are associated with the respective second leads 3.

The second dam portions 20 comprise slots 21, 22 extending immediately along the sectioning bars 13 and the second leads 3, respectively. Each second dam portion further comprises a non-slotted continuous margin 23 (FIGS. 21 and 22) of a small width L1 extending longitudinally of the leadframe 10 to define the side 4d of the molded resinous body 4 from which the second lead 3 projects out.

According to the fifth embodiment, the two sides 4a, 4d of the molded body 4 are defined by the first and second dam portions 18, 20 of the leadframe 10, respectively. Further, the remaining two sides 4b, 4c of the molded body are defined by the sectioning bars 13. Thus, in forming the molded body 4, the respective leads 2, 3 together with the respective dam portions 18, 20 as well as the sectioning bars 13 need only be sandwiched between a pair of molds (not shown) which have no reception groove for the leads, so that no flash formation occurs at four sides 4a–4d of the molded body.

Figure 21:
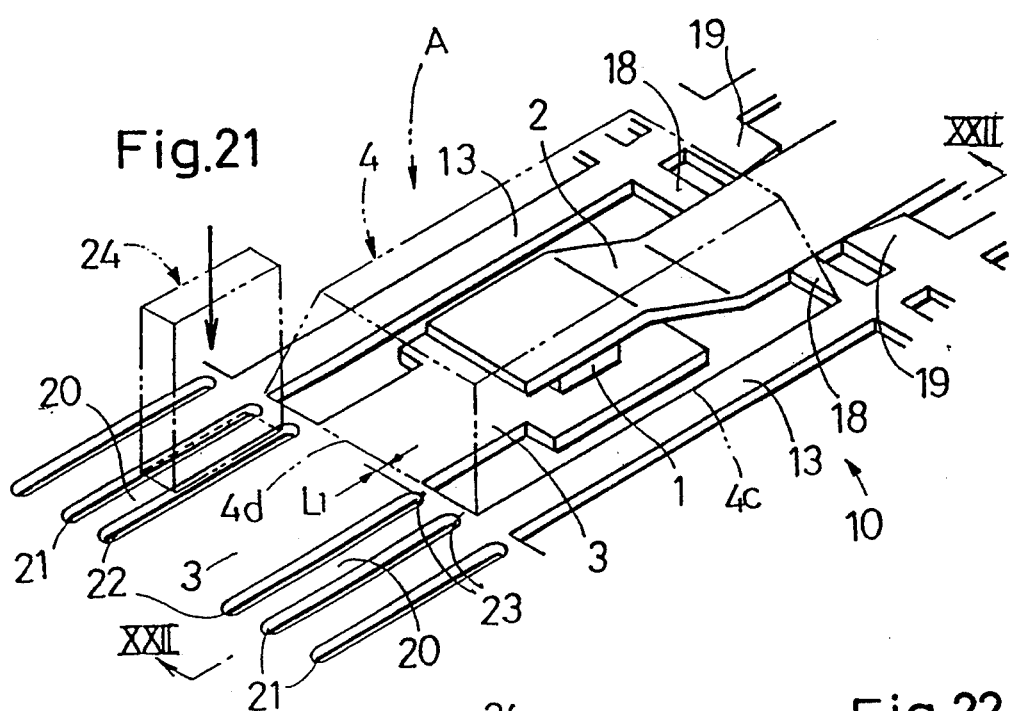
FIG. 21 is an enlarged fragmentary perspective view showing the leadframe of FIG. 19 after package molding.
Figure 22:
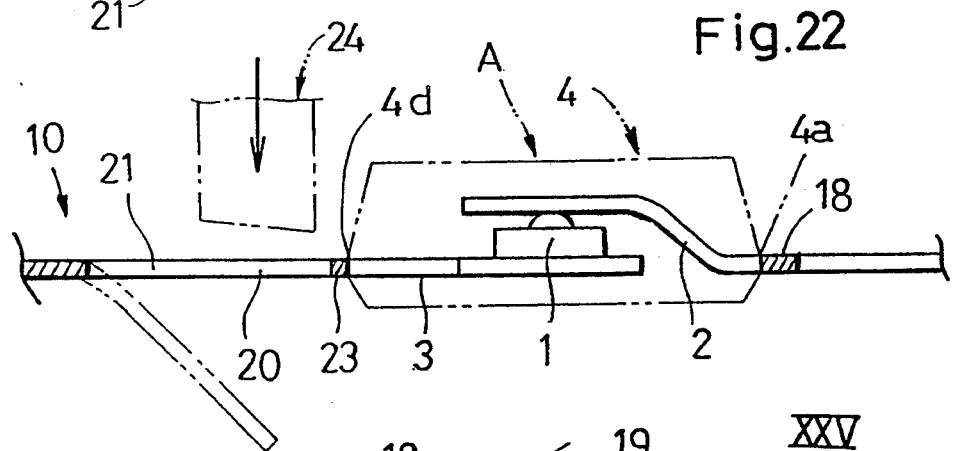
FIG. 22 is a sectional view taken along lines XXII—XXII in FIG. 21.

After formation of the molded body 4, a punch 24 may be pressed downward against the second dam portion 20 at a position thereof slightly spaced from the molded body, as shown in FIGS. 21 and 22. As a result, the dam margin 23 which is very small in width L1 is torn off, and the second dam portion 20 is bend downward, as indicated in phantom lines in FIG. 22. In such an operation, the punch 24, which is slightly spaced from the molded body 4, does not come into damaging contact with the molded body. Obviously, the punch 24 may be combined with a die (not shown) for completely shearing off the second dam portion 20 instead of bending it.

EMBODIMENT 6

Figure 23:
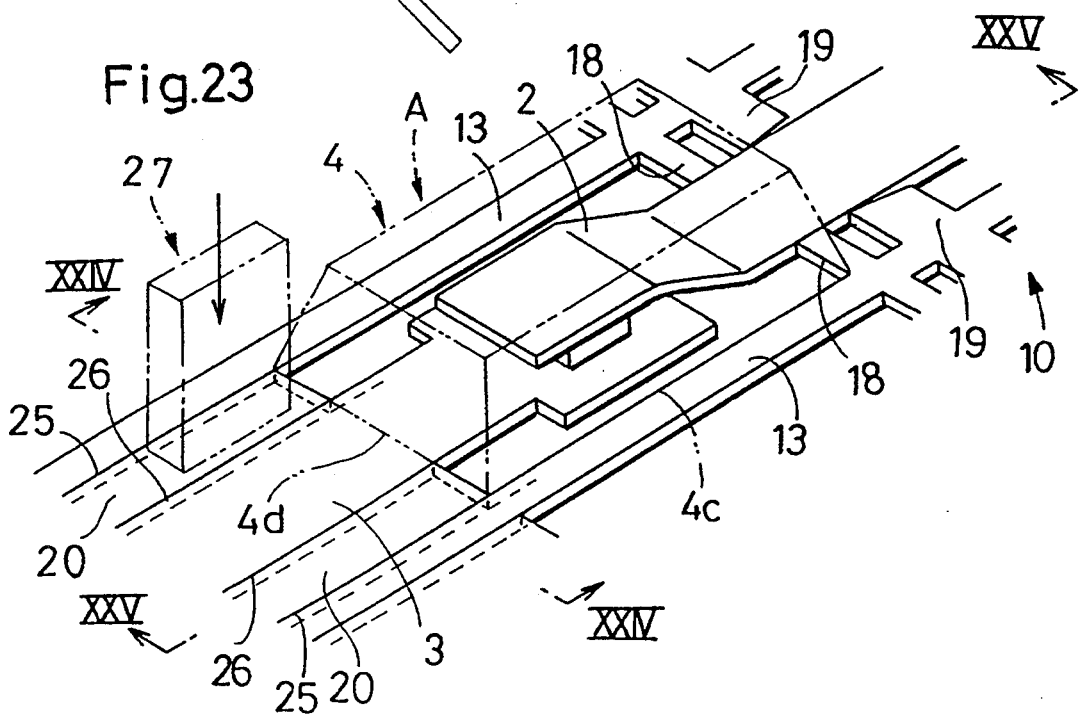
FIG. 23 is a fragmentary perspective view showing a leadframe according to a sixth embodiment of the present invention.
Figure 28:
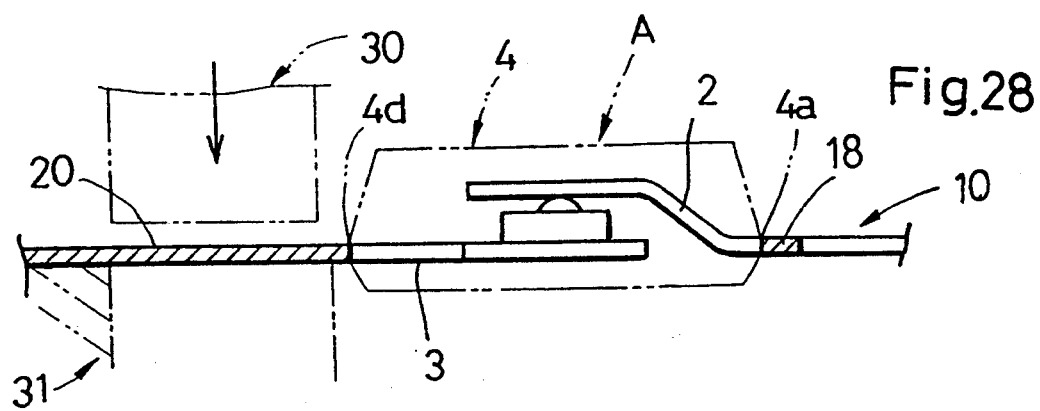
FIG. 28 is a sectional view taken along lines XXVIII—XXVIII in FIG. 26.
Figure 29:
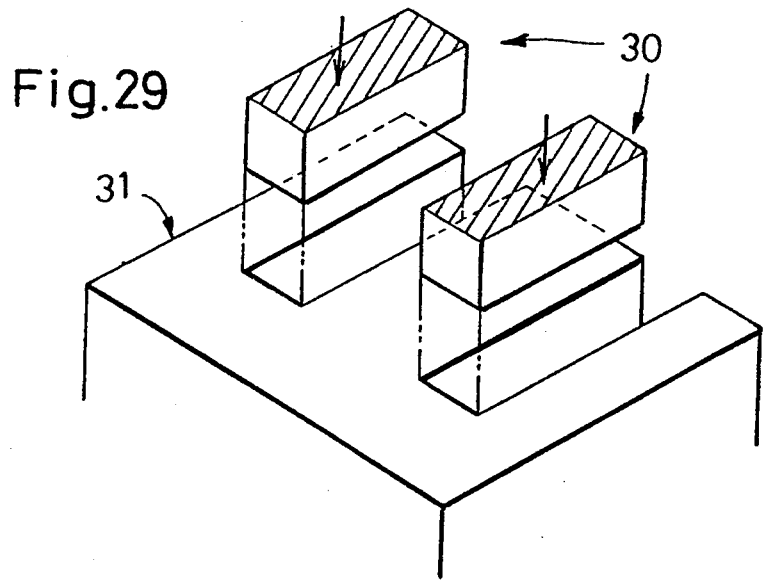
FIG. 29 is a perspective view showing a combination of punch and die usable for the seventh embodiment.
Figure 30:
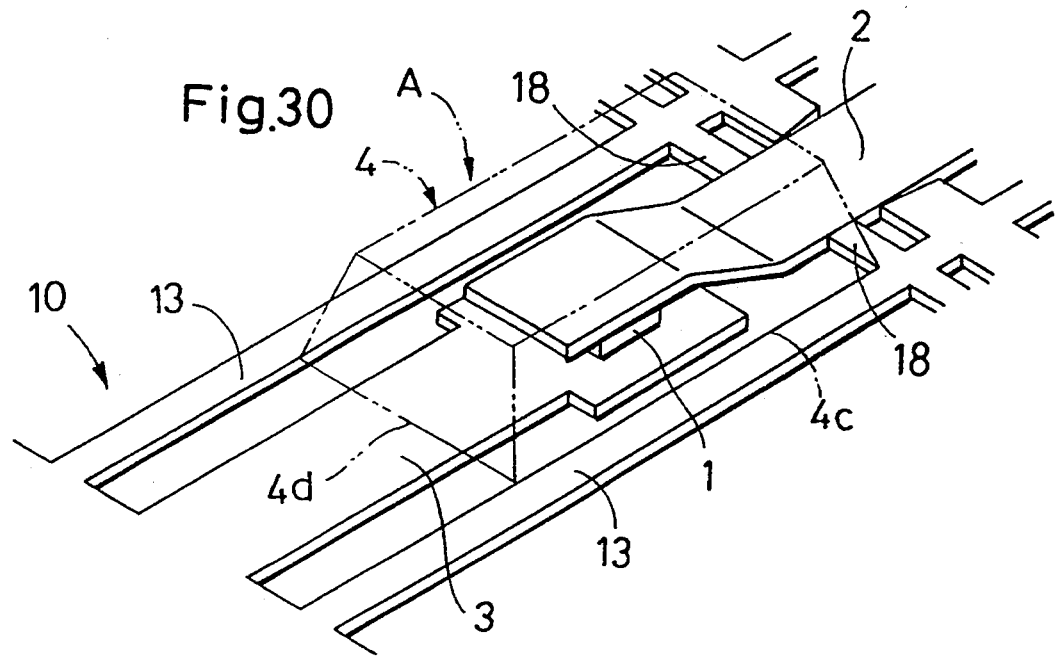
FIG. 30 is a perspective view similar to FIG. 26 but showing the same leadframe after punching.

FIGS. 23 through 25 show a sixth embodiment of the present invention which is a slight modification from the fifth embodiment shown in FIGS. 19–22.

Similarly the fifth embodiment, the leadframe 10 of the sixth embodiment incorporates first dam portions 18 associated with the first leads 2, and second dam portions 20 associated with the second leads 3. However, the sixth embodiment is different from the fifth embodiment in that each second dam portion 20 is formed with a pair of through-cut lines 25, 26 for subsequent separation from the second lead 3 and the sectioning bar 13 respectively.

After formation of the molded resinous body 4, the second dam portion 20 may be bent downward by a punch 27 which downwardly presses the second dam portion at a position thereof slightly spaced from the molded body without coming into damaging contact with the molded body, as shown in FIG. 25. Obviously, the through-cut lines 25, 26 make it easier to perform such bending. Alternatively, the punch 27 may be combined with a die (not shown) for completely shearing the second dam portion 20 off the leadframe 10.

EMBODIMENT 7

FIGS. 26 through 30 illustrate a seventh embodiment of the present invention.

Similarly to the sixth embodiment, the leadframe 10 according the seventh embodiment incorporates first and second dam portions 18, 20 for defining two sides 4a, 4d of the molded resinous body 4. However, instead of the through-cut lines 15, 16 shown for the sixth embodiment, each second dam portion 20 is provided a pair of V-shaped weakening grooves 28, 29 extending respectively along the corresponding sectioning bar 13 and the corresponding second lead 3 for a suitable length L2 (FIG. 26) from the corresponding side 4d of the molded body.

After formation of the molded body 4, a punch 30 in combination with a die 31 is used to shear each second dam portion 20 off the leadframe 10. The V-shaped weakening grooves 28, 29 provide easily shearing lines, so that shearing starts at the shearing lines as long as the punch 30 is brought within the length L2. As a result, the punch 30 may be spaced slightly from the molded body to avoid damaging contact therewith.

EMBODIMENT 8

Figure 31:
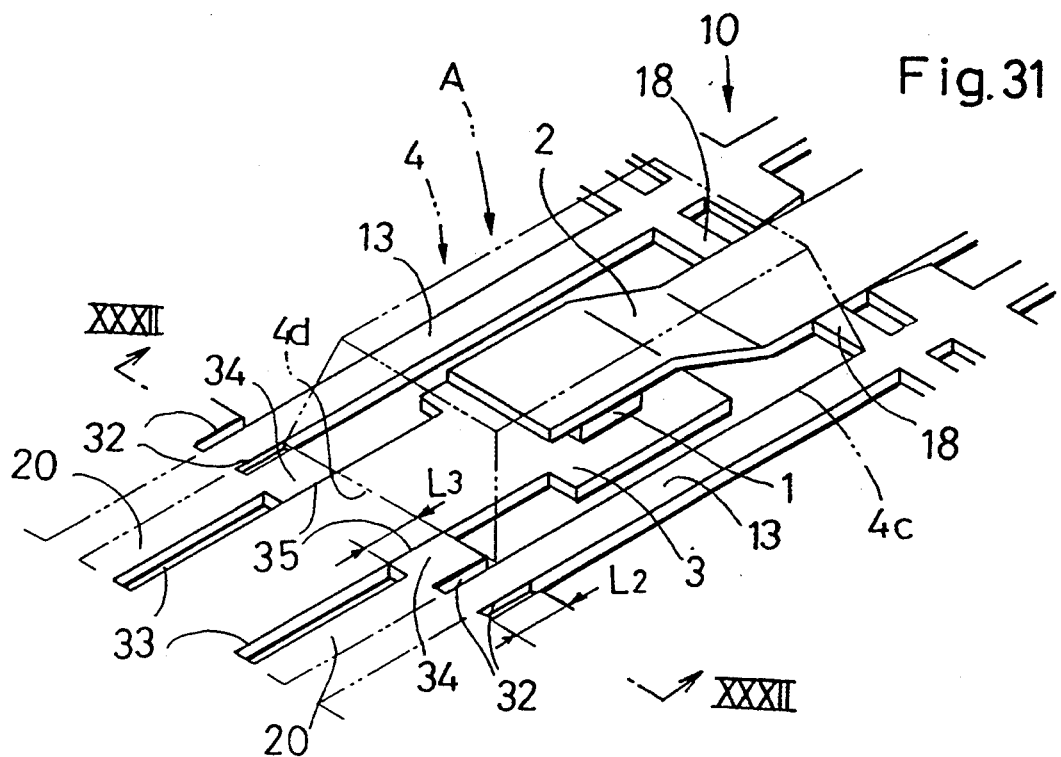
FIG. 31 is a fragmentary perspective view showing a leadframe according to a eighth embodiment of the present invention.
Figure 32:
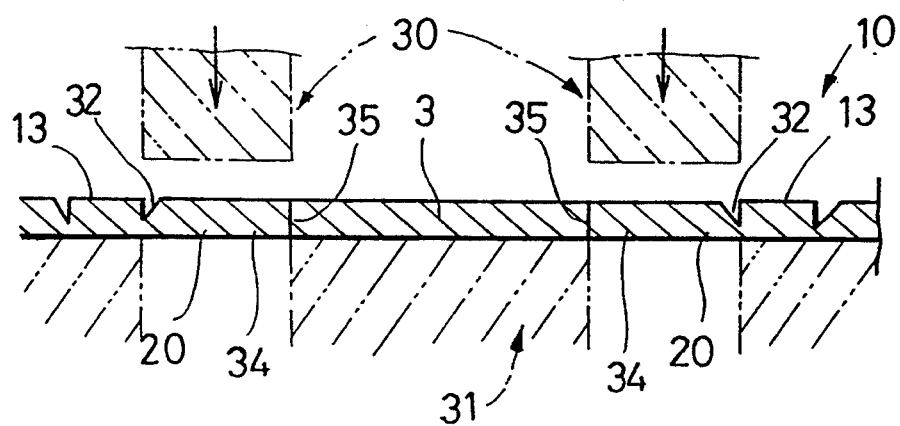
FIG. 32 is a sectional view taken along lines XXXII—XXXII in FIG. 31.
Figure 33:
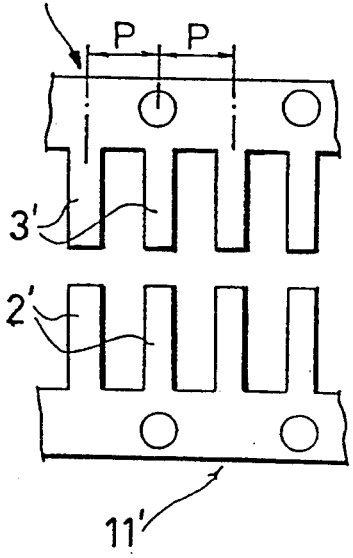
FIGS. 33 to 35 are plan views showing the successive stages of a prior art method for manufacturing electronic components.
Figure 34:
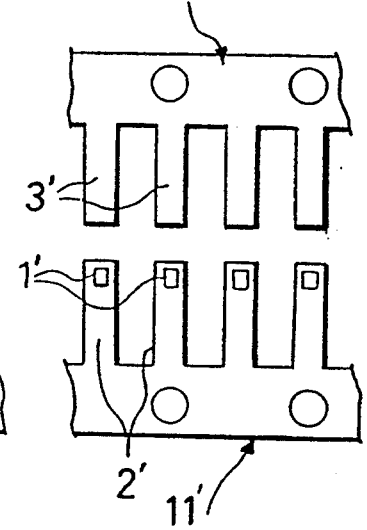
Figure 35:
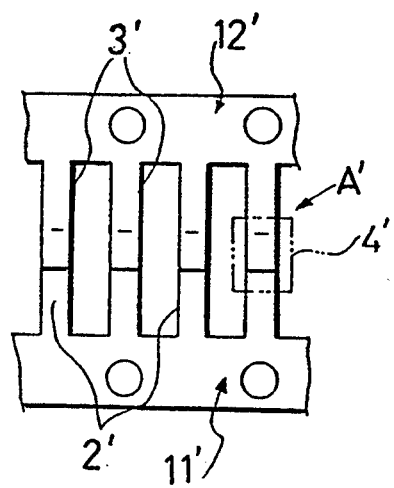
Figure 36:
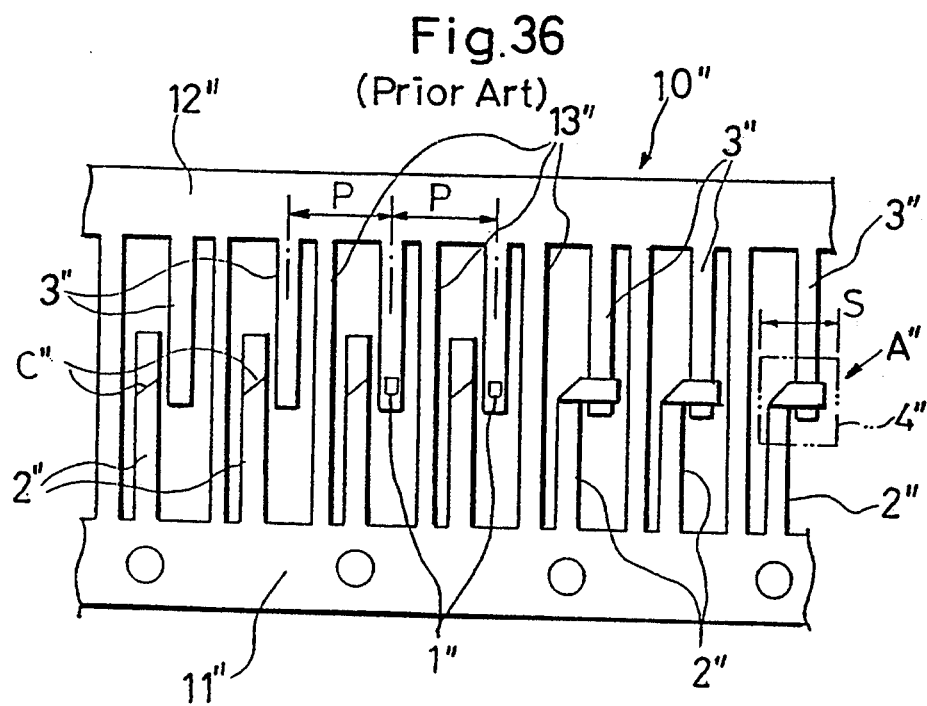
FIG. 36 is a plan view showing another prior art method of manufacturing electronic components.

FIGS. 31 and 32 represent an eighth embodiment of the present invention.

Similarly to the fifth to seventh embodiments, the leadframe 10 according to the eighth embodiment incorporates first and second dam portions 18, 20 for defining two sides of the molded resinous body 4. Each second dam portion 20 is provided a V-shaped weakening groove 32 extending immediately along the corresponding sectioning bar 13 for a suitable length L2 (FIG. 31) from the corresponding side 4d of the molded body. Further, the second dam portion 20 is formed with a slot 33 extending along the second lead 3 to a position short of the molded body, thereby leaving a dam margin 34. The dam margin 34 is formed with a through-cut line 35 extending along the second lead 3 for a suitable length L3.

After formation of the molded body 4, a punch 30 in combination with a die 31 is used to shear each second dam portion 20 off the leadframe 10. In so doing, the punch 30 may be spaced slightly from the molded body to avoid damaging contact therewith.

Obviously, the eighth embodiment may be modified so that the V-shaped weakening groove 32 is formed to extend along the second lead 3, whereas the slot 33 and the through-cut line 35 are made to extend along the sectioning bar 13.

The present invention being thus described, it is obvious that the same may be varied in many other ways. For instance, the third and fourth embodiments (FIGS. 9–18) may be modified so that the leadframe 10 has second dam portions 20. Such variations are not to be regarded as a departure from the spirit and scope of the present invention, and all such modifications as would be obvious to those skilled in the art are intended to be included in the scope of the following claims.

We claim:

1. A leadframe comprising:
   a plurality of first leads extending transversely of the leadframe, each of the first leads having a free end portion;

a plurality of second leads integral with and extending transversely of the leadframe, the second leads being initially spaced from but arranged substantially in alignment with the respective first leads transversely of the leadframe to form pairs with the respective first leads, each of the second leads having a tip portion; wherein the respective first leads are rendered integral with the leadframe only via twistable segments extending transversely of the respective first leads, the free end portion of each first lead being spaced from corresponding ones of the twistable segments by a distance which causes the free end portion of said each first lead to overlap the tip portion of a corresponding second lead when said each first lead is turned over toward said corresponding second lead by twisting the twistable segments.

2. The leadframe of claim 1, wherein said each first lead has a pair of openable legs for connection to the twistable segments.

3. The leadframe of claim 1, further comprising a first longitudinal side band, and a second longitudinal side band spaced transversely from the first side band but integrally connected thereto by transverse sectioning bars spaced longitudinally of the leadframe, wherein the respective pairs of leads are arranged between the respective sectioning bars, the twistable segments extending transversely of but integrally connected to the respective sectioning bars, the second leads being integrally connected directly to the second side band.

4. The leadframe of claim 3, further comprising a support bar extending transversely of and between each two adjacent sectioning bars, the support bar being located between said each first lead and said corresponding second lead without contacting them.

5. The leadframe of claim 3, further comprising dam means integral with the sectioning bars, each dam means serving to define one side, closer to the first side band, of a molded resinous body which is subsequently formed between each two adjacent sectioning bars, said each dam means having a reception clearance in which said first lead intimately fits when each first lead is turned over.

6. The leadframe of claim 5, further comprising guide means integral with the sectioning bars for guiding said each first lead into the reception clearance of said each dam means when said each first lead is turned over.

7. The leadframe of claim 6, wherein the guide means becomes substantially continuous with said each first lead when said each first lead is turned over, whereby fluid solder subsequently applied to said each first lead is allowed to flow onto said guide means.

8. The leadframe of claim 3, wherein the spacing between each two adjacent sectioning bars is set equal to the width of a molded resinous body which is subsequently formed between said each two adjacent sectioning bars so that said each two adjacent sectioning bars provide a dam function for defining two sides of the resinous body.

9. The leadframe of claim 3, further comprising dam means integral with the leadframe for defining one side, closer to the second side band, of a molded resinous body which is subsequently formed between each two adjacent sectioning bars.

10. The leadframe of claim 9, wherein said dam means comprises continuous marginal portions located on both sides of said corresponding second lead in immediate proximity to the molded body, said marginal portions being integral with said corresponding second lead and said each two adjacent sectioning bars, said dam means being formed with slots extending from said marginal portions toward the second side band immediately along said corresponding second lead and said each two adjacent sectioning bars, respectively.

11. The leadframe of claim 9, wherein said dam means is formed with through-cut lines extending from the molded body toward the second side band immediately along said corresponding second lead and said each two adjacent sectioning bars, respectively.

12. The leadframe of claim 9, wherein said dam means is formed with weakening grooves extending from the molded body toward the second side band immediately along said corresponding second lead and said each two adjacent sectioning bars, respectively.

13. The leadframe of claim 9, wherein said dam means is formed with combined grooves and through-cut lines extending from the molded body toward the second side band selectively but immediately along said corresponding second lead and said each two adjacent sectioning bars.

14. The leadframe of claim 13, wherein each through-cut line is followed by a slot extending further toward the second side band.

15. The leadframe of claim 1, further comprising dam means integral with the leadframe for defining one side of a subsequently molded resinous body from which said each first lead projects out.

16. The leadframe of claim 1, further comprising dam means integral with the leadframe for defining one side of a subsequently molded resinous body from which said corresponding second lead projects out.

17. The leadframe of claim 3, further comprising first dam means integral with the leadframe for defining one side, closer to the first side band, of a molded resinous body which is subsequently formed between each two adjacent sectioning bars, and second dam means integral with the leadframe for defining another side, closer to the second side band, of the molded body.

18. The leadframe of claim 17, wherein the spacing between said each two adjacent sectioning bars is set equal to the width of the molded resinous body so that said each two adjacent sectioning bars provide a dam function for defining the remaining two sides of the resinous body.

* * * * *